United States Patent [19]

Harris et al.

[11] Patent Number: 5,397,847
[45] Date of Patent: Mar. 14, 1995

[54] HEAT-RESISTANT LAMINATE MATERIALS AND PREPARATION THEREOF

[75] Inventors: Frank W. Harris, Akron, Ohio; Hiroyuki Furutani, Ohtsu, Japan

[73] Assignee: The University of Akron, Akron, Ohio

[21] Appl. No.: 92,225

[22] Filed: Jul. 15, 1993

Related U.S. Application Data

[63] Continuation-in-part of Ser. No. 963,844, Oct. 20, 1992, abandoned.

[51] Int. Cl.6 .................. C08L 77/00; C08L 79/08
[52] U.S. Cl. ............................ 525/432; 525/421; 525/431; 525/436
[58] Field of Search ............. 525/421, 432, 436, 431

[56] References Cited

U.S. PATENT DOCUMENTS

| | | | |
|---|---|---|---|
| 4,239,880 | 12/1980 | Darms | 528/125 |
| 4,271,288 | 6/1981 | Woo | 528/353 |
| 4,384,061 | 5/1983 | Reiter et al. | 524/104 |
| 4,395,514 | 7/1983 | Edleman | 524/600 |
| 4,421,929 | 12/1983 | Woo | 562/465 |
| 4,485,140 | 11/1984 | Gannett et al. | 428/260 |
| 4,851,280 | 7/1989 | Gupta | 428/246 |
| 4,857,405 | 8/1989 | Cordova et al. | 428/378 |
| 4,925,912 | 5/1990 | Rohde et al. | 528/229 |
| 4,996,101 | 2/1991 | Landis et al. | 525/432 |
| 5,002,823 | 3/1991 | Chen | 428/288 |
| 5,047,263 | 9/1991 | Glemet | 428/372 |
| 5,059,273 | 10/1991 | Boyce et al. | 428/473.5 |
| 5,066,536 | 11/1991 | Cogswell et al. | 428/216 |
| 5,104,944 | 4/1992 | Goldberg et al. | 525/436 |
| 5,124,199 | 6/1992 | O'Quinn et al. | 428/287 |
| 5,141,804 | 8/1992 | Riefler et al. | 428/290 |
| 5,147,966 | 9/1992 | St. Clair et al. | 528/188 |
| 5,155,179 | 10/1992 | Chung et al. | 525/432 |
| 5,175,242 | 12/1992 | Harris | 528/353 |
| 5,178,964 | 1/1993 | Scola et al. | 428/473.5 |

FOREIGN PATENT DOCUMENTS 209546  3/1990  European Pat. Off. .

*Primary Examiner*—John Kight, III
*Assistant Examiner*—P. Hampton-Hightower
*Attorney, Agent, or Firm*—Oldham, Oldham, & Wilson Co.

[57] ABSTRACT

This invention relates to heat-resistant polyimide blends and laminates thereof, which have excellent heat and moisture resistance, and excellent mechanical properties, including outstanding toughness. The blends contain a thermoplastic polyimide component and a thermosetting imide oligomer. The weight ratio of the thermoplastic component to thermosetting component is selected in the range of 99/1 to 5/95. The thermoplastic polyimide component has a number average molecular weight of 10,000 or more.

8 Claims, 1 Drawing Sheet

HEAT-RESISTANT LAMINATE MATERIALS AND PREPARATION THEREOF

This application is a continuation-in-part of Ser. No. 07/963,844, filed 10120192, now abandoned.

Technical Field of the Invention

The present invention relates to novel heat-resistant polyimide blends and laminate materials thereof, which have excellent heat-resistance and moisture-resistance, and possess excellent mechanical properties, including outstanding toughness.

Additionally, the present invention relates to: new laminates made from blends of thermoplastic polyimides and thermosetting imide oligomers having improved thermal stability, high $T_g$ and improved mechanical properties; and new high strength, low cost, fracture resistant, reinforced polyimide composites and laminates made from said blends where the composite is reinforced by fibrous materials such as carbon fibers, glass fibers, or Kevlar ® and processes for their manufacture.

BACKGROUND OF THE INVENTION

Polyimides are useful as components which require excellent thermal, electrical and/or mechanical properties. For general discussion of polyimides preparation, characterization and applications see *Polyimides, Synthesis, Characterization and Applications*, K. L. Mittal, ed Plenum, NY 1984.

Polyimides based on pyromellitic dianhydride and various organic diamines are disclosed in U.S. Pat. No. 4,485,140 to Gannett et al (E. I. DuPont de Nemours and Co.).

Polyimides based on diamines such as 2,2'-di-(p-aminophenyloxy)diphenyl and various dianhydrides are disclosed in U.S. Pat. No. 4,239,880 to Darms (Ciba-Geigy Corp.).

Harris et al. in U.S. patent application Ser. No. 07/315,327, has disclosed the preparation of soluble polyimides based on polyphenylated dianhydrides. The polyimides taught in this reference are typically rod like polyimides and possess little if any thermoplastic properties.

In U.S. Pat. No. 4,271,288, 4,239,694 and 4,421,929, Woo (DOW Chemical Co.) teaches the use of certain tetracarboxylic acids as condensation monomers with diamines including oxyalkylene and alkylenedioxy diamines. However, none of these diamines have geminal alkyl groups beta to the carbon atom bearing the aromatic amino end group.

Numerous patents deal with the manufacture of composites utilizing carbon fibers or other similar fibrous reinforcing agent with polyimides. In U.S. Pat. No. 4,851,280, Gupta teaches the use of carbon fiber reinforced polyimide composites for fabricating tools. Gupta teaches the use of a different class of polyimides than those employed in the present invention.

In U.S. Pat. No. 4,395,514, Edelman teaches a process for the preparation of polyimide composites including carbon fiber reinforced polyimide composites. The main thrust of the Edelman patent is the use of a class of cyclic peroxymetal catalysts. Edelman teaches the use of divalent aryl radicals.

Recently, with advances in electric circuitry, copper-clad laminates have been used in new ways and required to have superior characteristics. Particularly, an increase in wiring density has been required, leading to lamination of wiring boards and also to size reduction of the through holes. In these circumstances, there is a demand for copper-clad laminates, which are processible under mild conditions, and less subject to smear generation during drilling. Meanwhile, there are also demands for productivity improvement and cost reduction dictating more and more stringent processing conditions in actually mounting wiring boards, particularly in connection with the hot air leveler or reflow soldering. Key requirements are superior heat resistance and moisture resistance of the copper-clad laminates as substrates than heretofore obtainable.

To meet these demands, there is a trend for utilizing additionally hardened polyimide resins in lieu of epoxy resins, which have been finding extensive applications for copper-clad laminates. It is well known in the art that polyimide resins, when utilized for copper-clad lamination, are advantageous in that substantially no smear is generated during drill processing and that their heat resistance during processing is improved.

However, the prior art hardened polyimide resins have posed the following problems. For example, while Kerimid TM resins, which are primarily composed of a combination of bismaleimide and 4,4'-diaminodiphenyl methane, have excellent lamination characteristics, 4,4'-diaminodiphenyl methane used in the synthesis is highly reactive, thus posing a shelf-life problem. The varnish and prepreg using it can be used for only a short period of time. Additionally, 4,4'-diaminodiphenyl methane is toxic to the human body. Kerimid processing requires heating at high temperatures for long periods of time, which is a significant disadvantage. Further, those resins which are obtainable from bismaleimides and diamines, are inferior in their moisture resistance. Therefore, preservation of the obtained laminates has traditionally required detailed attention to moisture absorption.

In order to solve the above problems inherent in polyimide, many improvements have been proposed, particularly various polyester imide resins, such as those described in U.S. Pat. Nos. 4,757,118, 4,362,861, and 3,852,246, and Japanese Patent Application Laid-Open No. 1-123819. Those resins which are obtainable by reacting N,N'-bisimide of unsaturated dicarboxylic acids and aminoethyl benzoate, although suitable for laminates, are inferior in their solubility in low-boiling solvents and pose problems in their coating on glass cloth or fiber or the like when producing prepregs. Further, their solutions must be preserved with care.

None of the above composite patents teach or insinuate that the polyimides or polyimide composites of the present invention would have the unusual properties necessary.

SUMMARY OF THE INVENTION

Figure 1:
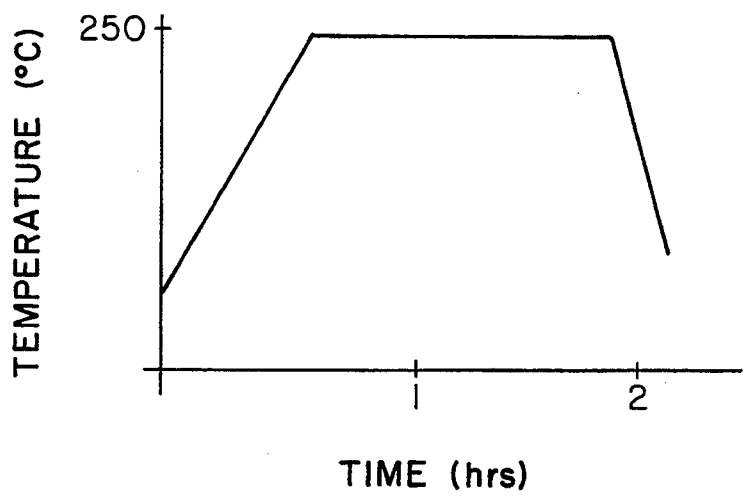
FIG. 1 illustrates a prepreg drying cycle showing a heating ramp under vacuum followed by a one hour hold time at 250° C. followed by a rapid cooling ramp still under vacuum.

We have discovered that a desirable new class of polyimide compositions which have excellent heat and moisture resistance, are soluble in organic solvents, have good mechanical processing properties and are suitable for laminating and molding. These properties will make the polyimides and polyimide components ideally suited for use in the production of high performance compositions.

An object of this invention is to provide novel polyimide blends of thermoplastic polyimides and thermosetting imide oligomers.

It is a further object of this invention to provide novel polyimide blends of thermoplastic polyimides and thermosetting imide oligomers which can be coated on a reinforcement material.

A further aspect of this invention is to provide a method of manufacturing the heat-resistant laminate by using tetracarboxylic acid derivatives with an organic diamine to form a polyamic acid prepolymer which upon addition of a thermosetting imide oligomer forms the novel polyimide blend, which can then be coated and impregnated on a reinforcement material.

A further aspect of this invention is to provide a method of manufacturing the heat-resistant laminate by using tetracarboxylic acid derivatives with an organic diamine to form a polyamic acid prepolymer which upon the addition of a thermosetting imide oligomer forms the novel polyimide blend, which can then be coated and impregnated on a reinforcement material, which upon drying forms a prepreg which is suitable for laminating.

DETAILED DESCRIPTION OF THE INVENTION

The novel heat-resistant laminate blend material according to the invention comprises, as essential components: (1) a thermoplastic polyimide represented by the structure as shown in formula (I),

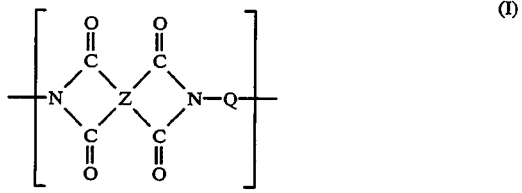

(I)

where Z is a tetravalent organic radical selected from the group consisting of a carbocyclic aromatic containing radical and a heterocyclic aromatic containing radical where each anhydride group is located on an aromatic ring with the carbonyl units in an ortho orientation relative to one another, and where Q is divalent organic radical selected independently from the group consisting of a carbocyclic aliphatic radical, a carbocyclic aromatic containing radical, and a heterocyclic containing radical, wherein the term carbocyclic aromatic containing radical and heterocyclic aromatic containing radical used to define Z, is meant to include any radical which has the anhydride groups attached to one or more aromatic ring(s) and when describing Q has the amine groups attached to one or more aromatic ring(s), and wherein while the rings are usually unsubstituted, they may be substituted, particularly with halogens; and (2) a thermosetting imide oligomer represented by formula (II), representative examples of which are commercially available in the United States as Thermid ®-series from National Starch Co., and in Japan from Kanebo, NSC Co., Ltd.

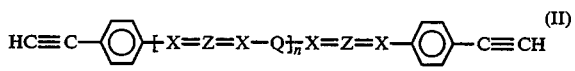

(II)

wherein Q and Z have the values previously defined, the groups Z being either the same or different, n being a positive integer of from 1 to 30, and X is a form of trivalent bond shown attached to group Z, which occupies two of the bonds, thereby leaving one additional bond for subsequent bonding to other components of the oligomer, and selected from the chemical formula group consisting of

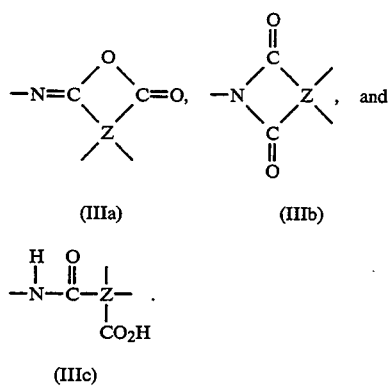

(IIIa) (IIIb)

(IIIc)

The thermoplastic polyimide represented by formula (I) represents the polycondensation reaction of at least one dianhydride of formula (IV)

(IV)

and one diamine of formula (V)

(V)

wherein Z and Q are as previously defined.

In preparing the above polyimides, a diamine of formula (V) is reacted with a dianhydride of formula (IV) or ester derivatives of the dianhydride of formula (IV). The combined molar amounts of the diamine and dianhydride or dianhydride derivative, should be close to a one to one molar mixture. However, 10% excess of either component is acceptable. Once the polymerization has been completed, the last component to react will determine the polymer end group. The polymer end groups can, thus, be an amino group, an anhydride group or a mixture thereof.

Alternately, a chain termination or limiting reagent can be added to the polymerization mixture to force termination of a growing polymer chain. Such chain termination or limiting reagents are used to limit the molecular weight of the polymer and are well known in the art. Amine termination reagents commonly employed include aniline or substituted anilines. Common carboxy terminating reagents include phthalic anhydride and other similar aromatic anhydrides.

Without being limited to the following list, in that the examples are for purposes of illustrating members of the type of dianhydrides of formula (IV) are selected from the representative and illustrative group consisting of: pyromellitic acid dianhydride, 3,6-diphenylpyromellitic dianhydride, 3,3',4,4'-benzophenonetetracarboxylic acid dianhydride, 2,3,3',4'-benzophenonetetracarboxylic acid dianhydride, 2,2',3,3'-benzophenonetetracarboxylic acid dianhydride, 3,3',4,4'-biphenyltetracarboxylic acid dianhydride, bis(2,3-dicarboxyphenyl)methane dianhydride, bis(2,5,6-trifluoro-3,4-dicarboxyphenyl)methane dianhydride, 2,2-bis(2,3-dicarboxyphenyl)propane dianhydride, bis(3,4-dicarboxyphenyl) ether dianhydride, bis(3,4-dicarboxyphenyl)sulfone dianhydride, N,N-(3,4-dicarboxyphenyl)-N-methylamine dianhydride, bis(3,4-dicarboxyphenyl)diethylsilane dianhydride, 2,2-bis(3,4-dicarboxyphenyl)-1,1,1,3,3,3-hexafluoropropane dianhydride, 4,4'-[4,4'-isopropylidenedi(p-phenyleneoxy)]bis(phthalic anhydride) which is derived from the General Electric bis-phenol A ™, 2,3,6,7- and 1,2,5,6-naphthalene-tetracarboxylic acid dianhydride, 2,6-dichloronaphthalene-1,4,5,8-tetracarboxylic acid dianhydride, thiophene-2,3,4,5-tetracarboxylic acid dianhydride, pyrazine-2,3,5,6-tetracarboxylic acid dianhydride and pyridine-2,3,5,6-tetracarboxylic acid dianhydride as well as esters of the above listed compounds.

Without being limited to the following list, in that the examples are for purposes of illustrating members of the diamine of formula (V) include:
2,6-diaminopyridine, 2,5-diaminopyridine, 2,4-diamino-6-hydroxypyrimidine,
2,4-diaminopyrimidine, 3,5-diamino-1,2,4-triazole, 4-chloro-2,6-diaminopyrimidine,
2,4-diamino-s-triazine, 2-chloro-4,6-diaminotriazine, 6,6'-diamino-2,2'-bipyridine,
1,4-diaminobenzene, 1,3-diaminobenzene, 4,4'-diaminodiphenyl ether,
3,4'-diaminodiphenyl ether, 1,3-bis(3-aminophenoxy)benzene,
1,3-bis(4-aminophenoxy)benzene, 1,4-bis(3-aminophenoxy)benzene,
1,4-bis(4-aminophenoxy)benzene, 4,4'-bis(4-aminophenoxy)-1,1'-biphenyl,
4,4'-bis(3-aminophenoxy)-1,1'-biphenyl,
2,2'-bis(trifluoromethyl)-4,4'-diamino-1,1'-biphenyl,
1,3-bis(4-aminophenoxy)-2,2-dimethylpropane,
1,3-bis(4-aminophenoxy)-2,2-diethylpropane, 1,2-bis(3-aminophenoxy)ethane,
1,2-bis(4-aminophenoxy)ethane, bis[2-(4-aminophenoxy)ethyl]ether,
bis[2-(3-aminophenoxy)ethyl]ether, bis{2-[2-(4-aminophenoxy)ethoxy]ethyl}ether,
1,2-bis[2-(4-aminophenoxy)ethoxy]ethane,
1,3-bis(4-aminophenoxy-4'-benzoyl)benzene,
1,4-bis(4-aminophenoxy-4'-benzoyl)benzene,
4,4'-bis(4-aminophenoxy-4'-benzoyl)benzophenone,
4,4'-bis(4-aminophenoxy-4'-benzoyl)diphenylether, and
1,4-bis(4-aminophenoxy)-2-phenylbenzene. In a preferred embodiment of this invention, the thermoplastic polyimide will have generic formula (VI),

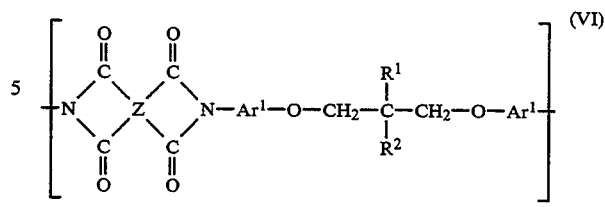

where, $R^1$ and $R^2$ are selected from the group consisting of hydrogen, aliphatic and aromatic groups from 1 to 18 carbons, and halogenated aliphatics and aromatics from 1 to 18 carbons, $Ar^1$ is a divalent organic aromatic group where the ether linkage and amine linkage are in a para arrangement, and Z is as defined previously. This composition is coated, in solution form, on a reinforcing material for impregnating and then dried.

In this laminate material, the weight ratio of component (I) / component (II) is selected in a range of 99:1 to 5:95. The heat-resistant thermoplastic polyimide (I) has a number-average molecular weight of 10,000 or above.

The method of manufacturing a novel heat-resistant laminate material according to the invention comprises coating and impregnating a blend solution composed of a polyamic acid solution of a precursor of thermoplastic polyimide represented by formula (I) with a solution of thermosetting imide oligomer represented by formula (II) on a reinforcing material, and then drying the system.

One method of manufacturing a novel heat-resistant laminate material according to the invention comprises synthesizing a tetracarboxylic acid moiety or derivative thereof of chemical formula represented by formula (VII)

where, Y represents a hydrogen or an alkyl group from 1 to 18 carbons, the Y groups either being the same or different, and Z is as defined previously. In a preferred embodiment of the invention, the ratio of alkyl / hydrogen functionality for Y will be 50/50. The tetracarboxylic acid or derivatives thereof, are prepared from the tetracarboxylic acid dianhydrides and water or alcohols in an aprotic polar solvent or mixture of solvents, in an inert gas atmosphere and in a temperature range of 50 to 150° C. Alternatively, the derivative could be prepared first in excess alcohol and subsequently added to the aprotic polar solvent or solvent mixture. In this specific embodiment, a polyamic acid prepolymer is subsequently prepared by adding an organic diamine represented by formula (VIII)

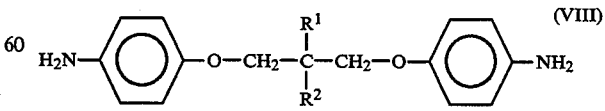

where, $R^1$ and $R^2$ each represent a substituent group selected from the group consisting of hydrogen and aliphatic groups with 1 to 18 carbons, halogenated aliphatics and aromatics, including halogenated aromatics, the groups $R^1$ and $R^2$ being the same or different, under the same conditions. The blend is then obtained by adding a thermosetting imide oligomer represented by formula (II),

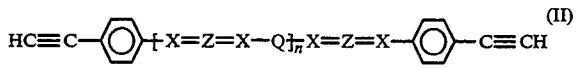

to the prepolymer solution where X, Q, and Z are as defined previously. A laminate is produced by coating and impregnating a reinforcement material with the blend resin composition thus prepared, producing a prepreg by drying the impregnated material to a predetermined residual solvent concentration, and laminating a plurality of prepregs thus obtained using a press with heater. During the processing, the polyamic acid is converted to the corresponding polyimide and the terminal acetylene groups on the oligomer are polymerized.

In this method of manufacture of this novel heat-resistant laminate material, the concentration of the blend resins in the composition ranges from 5 to 85% by weight. In addition, in the method of manufacture of this novel heat-resistant laminate material, the residual solvent concentration of the prepreg after drying, with respect to the resin ranges from 1 to 20% by weight.

BEST MODE FOR CARRYING OUT THE INVENTION

General Reaction Procedure

First, a reaction vessel is dried and filled with an inert gas, for instance argon or nitrogen gas, followed by the addition of a predetermined amount of a non-aqueous polar solvent into the vessel. In the inert gas atmosphere, the tetracarboxylic acid moiety or derivative thereof represented by formula (VII) is synthesized from the corresponding tetracarboxylic acid dianhydride and water or alcohols in a temperature range of 50 to 150° C., preferably 50 to 100° C., and in a most preferred embodiment, 80° C.±5° C., for 1 to 5 hours, and more preferably within 2 hours.

Then, under similar conditions, a polyamic acid prepolymer is synthesized by adding an organic diamine represented by formula (V). The reaction is effected in the same temperature range as noted above in 1 to 10 hours, preferably 1 to 5 hours, and most preferably within 2 hours.

Subsequently, a blend solution, is prepared by adding a thermosetting imide oligomer represented by formula (II). The thermosetting imide oligomer represented by formula (II) can be in the form of an acetylene end-capped imide, isoimide or amic acid. The oligomer noted above may be readily synthesized by using well known techniques disclosed in, for instance, Japanese Patent Application Laid-Open No. 53-119865. In addition, it is possible to use those which are provided as "Thermid Series" from Kanebo NSC Co., Ltd.

The diamine component comprises, as its essential component, an organic diamine represented by formula (IV), but it is possible to copolymerize with the diamine represented generically by formula (IX)

$$H_2N-Q'-NH_2 \quad (IX)$$

where, Q' in the organic diamine compound represented by formula (IX) may be any divalent organic group described previously, and most preferably, contains at least one aromatic group. In an analogous manner, it is possible to copolymerization with a dianhydride of formula (IV) using the substitution of Z' for Z, but being selected from within the same Markush grouping.

Without being limited to such, specific examples of Q and Q' are:

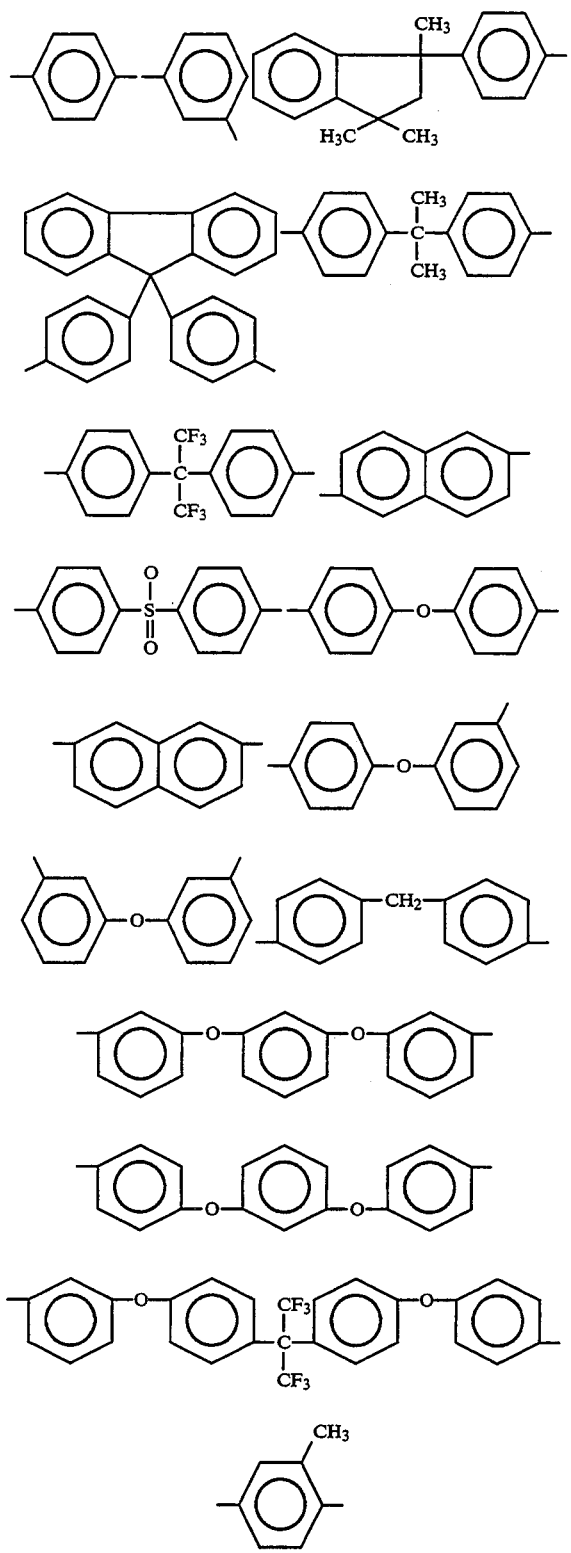

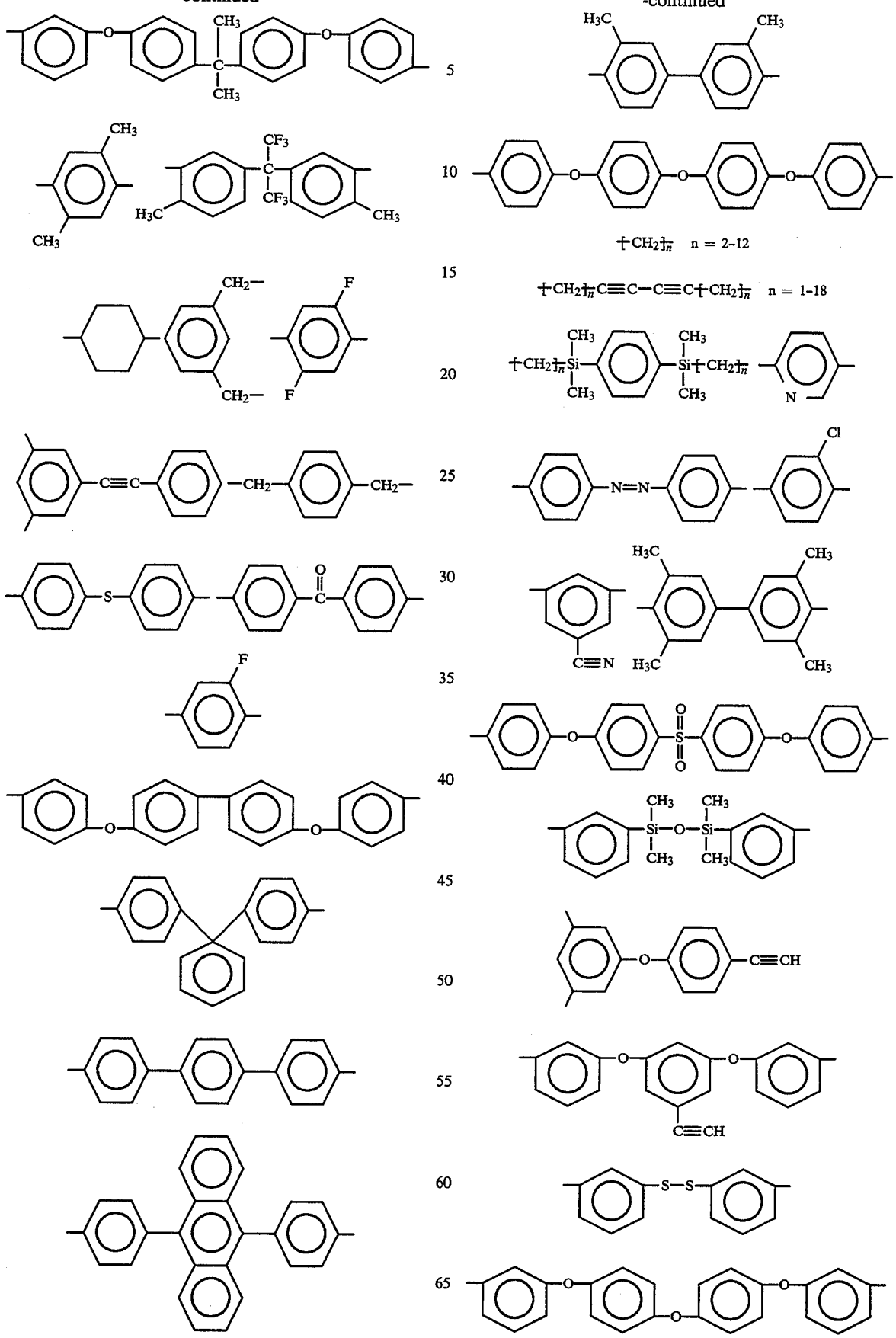

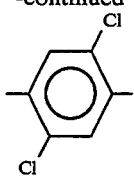
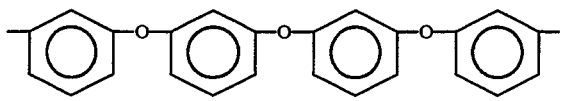
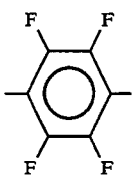

Once again, without being limited to such, examples representative of the Markush groups Z and Z' would include:

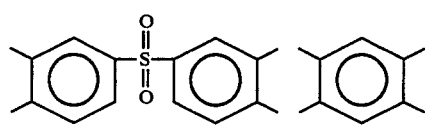
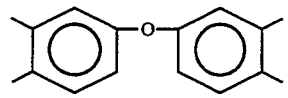
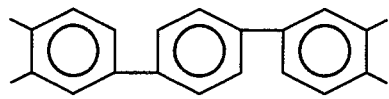
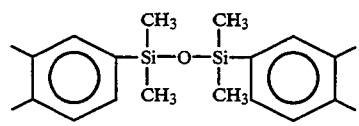
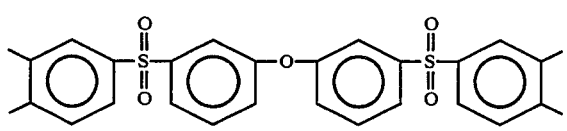
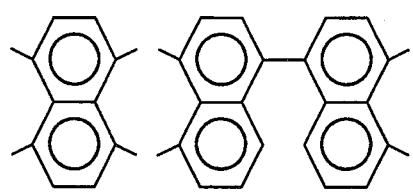
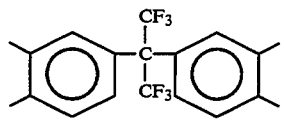

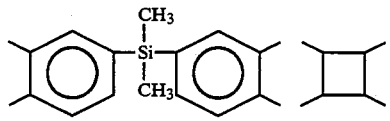
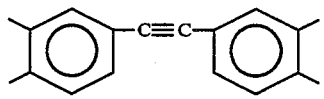
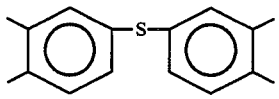
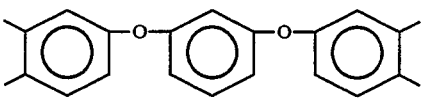
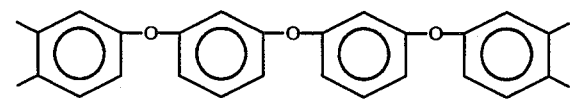
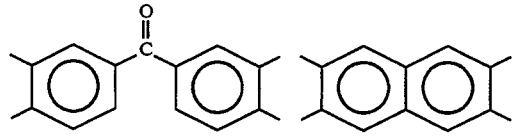
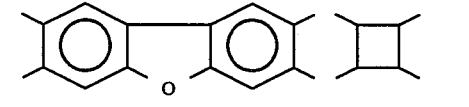
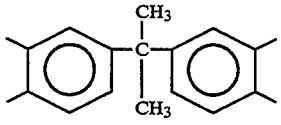
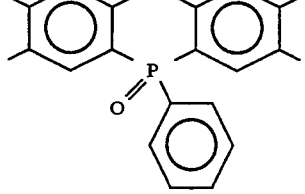
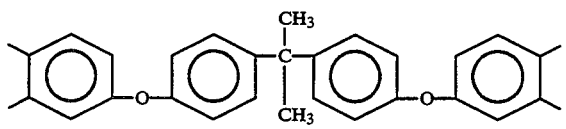

Examples of the aprotic polar organic solvents used for the reaction to produce the polyamic acid are such ether solvents as tetrahydrofuran and dioxane, such sulfoxide solvents as dimethyl sulfoxide and diethyl sulfoxide, such formamide solvents as N,N'-dimethylformamide (DMF) and N,N'-diethylformamide, and such acetamide solvents as N,N'-dimethylacetamide (DMAc), N,N'-diethylacetamide and N-methylpyrolidinone (NMP). These solvents may be used either alone or in combinations of two or more. Further, these solvents may be used in mixtures with non-solvents of polyamic acids, e.g., methanol, ethanol, isopropanol, benzenemethyl cellosolve. From the stand-point of the operation control, it is suitable to use N,N'-dimethylacetamide (hereinafter referred to as DMAc) and tetrahydrofuran (hereinafter referred to as THF).

The number-average degree of polymerization (DP; P. J. Flory, Principles of Polymer Chemistry: Cornell University Press: Ithaca, N.Y., p. 91, 1953) of the thermosetting imide oligomer, one of the constituent components according to the invention, is suitably 1 to 30, preferably 1 to 15, more preferably 1 to 10. If the degree of polymerization is excessive, the solubility in organic solvents is reduced. If the degree of polymerization is insufficient, on the other hand, problems are posed in connection with the mechanical strength.

As for the thermoplastic polyimide as the other constituent component according to the invention, the molecular weight is not particularly limited. However, in order to maintain the mechanical strength of the product polyimide resin, the number-average molecular weight is suitably 10,000 or above, preferably 20,000 or above, more preferably 30,000 or above, particularly preferably 40,000 or above. It is often difficult to directly measure the molecular weight of polyimide polymers. In such cases, the measurement is made indirectly by estimation. For example, where a polyimide copolymer is synthesized from polyamic acid, a value corresponding to the molecular weight of the polyamic acid may be thought to be the molecular weight of polyimide.

Since the composition according to the invention comprises as its essential component the polyimide resins having the reactivity as described above, it is possible to use in combination, if necessary, well-known epoxy resins, epoxy resin hardening agents, hardening promoters, fillers, incombustible agents, reinforcing agents, surface treatment agents, pigments and various elastomers.

A well-known epoxy resin is a compound having two or more epoxy (or glycidyl) groups in its molecule. As an example, it may be at least one member of the group consisting of polyglycidylether compounds derived from divalent and higher valence phenols, e.g., bisphenol A, bisphenol F, hydroquinone, resorcinol, furylglycine, tris-(4-bisphenol F, hydroquinone, resorcinol, furylglycine, tris-(4-hydroxyphenyl) methane, 1,1,2,2-tetrakis (4-hydroxyphenyl) ethane, etc., from tetrabromobisphenol A and other brominated polyphenols, and from novolak and other halo-polyphenols, novolak epoxy resins as products of reaction between phenols, e.g., phenol, orthocresol, etc., and formaldehyde, amine epoxy resins derived from aniline, p-aminophenol, m-aminophenol, 4-amino-metacresol, 6-amino-metacresol, 4,4'-diaminodiphenyl methane, 3,3'-diaminodiphenyl methane, 4,4'-diaminodiphenyl ether, 3,4'-diaminodiphenyl ether, 1,4-bis(4-aminophenoxy)benzene, 1,4-bis(4-aminophenoxy)benzene, 1,3-bis (3-aminophenoxy)benzene, 2,2-bis(4-aminophenoxyphenyl)propane, p-phenylene diamine, m-phenylene diamine, 2,4-toluene diamine, 2,6-toluene diamine, p-xylene diamine, m-xylene diamine, 1,4-cyclohexane-bis(methyl amine), 1,3-cyclohexane-bis(methyl amine), 5-amino-1-(4'-aminophenyl)-1,8,8,-trimethyl indane, 6-amino-1-(4-aminophenyl)-1,8,8-trimethyl indane, etc., glycidyl ester compounds derived from aromatic carboxylic acid, e.g., p-oxybenzoic acid, terephthalic acid, isophthalic acid, etc., indane epoxy resins derived from 5,5-dimethyl indane etc., and alicyclic epoxy resins, e.g., 2,2-bis(3,4-epoxycyclohexyl)propane, 2,2-bis [4-(2,3-epoxypropyl)cyclohexyl]propane, 2,2-bis [4-(2,3-epoxypropyl)cyclohexyl]propane, vinylcyclohexane dioxide, 3,4-epoxycyclohexane carboxylate, etc., and further triglycidyl isocyanulate and 2,4,6-triglycidoxy-s-triadine, etc. These resins may be used alone or in combinations of two or more of them.

Examples of well-known epoxy hardening agents are phenolic hardening agents, e.g., phenol novolak, cresol novolak, etc., and hydrazide compounds. Examples of the hardening promoters are amines, e.g., benzyldimethyl amine, 2,4,6-tris (dimethylaminomethyl) phenol, 1,8-diazabicycloundecene, etc., imidazole compounds, e.g., 2-ethyl-4-methyl imidazole, and boron trifluoride amine complexes. To improve the mechanical strength, well-known elastomers may be effectively added. Examples of the well-known elastomers are:

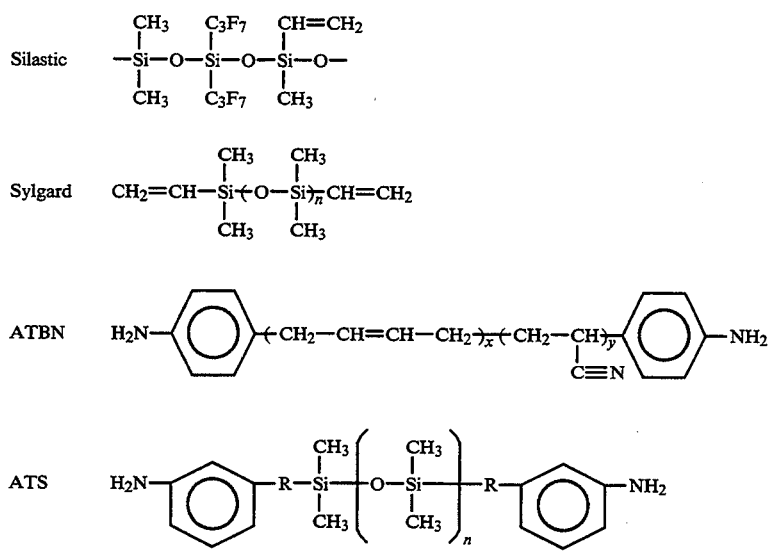

-continued

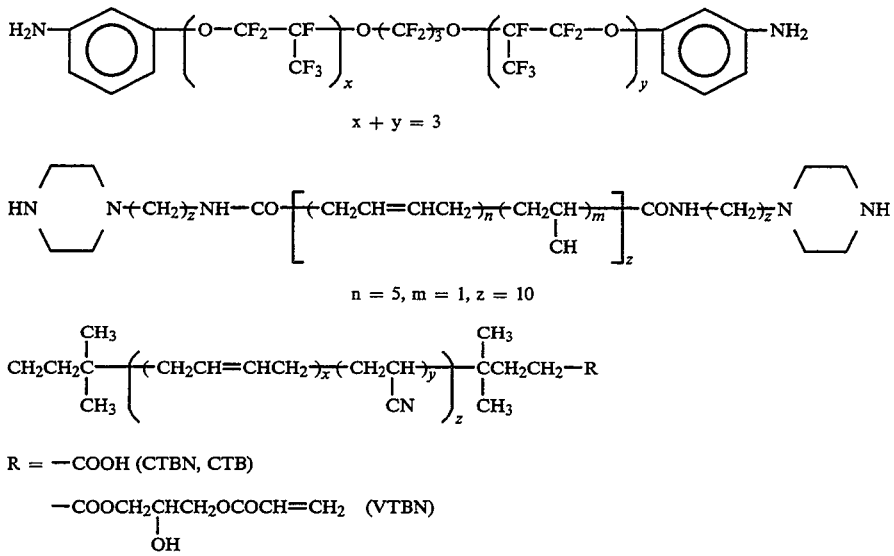

$x + y = 3$ $$\text{HN}\underset{\diagdown\_\diagup}{\diagup\overset{\diagdown}{\phantom{x}}}\text{N} \overset{}{\text{(CH}_2\text{)}_{\overline{n}}}\text{NH} - \text{CO} - [-(\text{CH}_2\text{CH}=\text{CHCH}_2)_{\overline{n}}(\text{CH}_2\text{CH})_{\overline{m}} -]_z - \text{CONH} (\text{CH}_2)_{\overline{n}} \text{N} \underset{\diagdown\_\diagup}{\diagup\overset{\diagdown}{\phantom{x}}} \text{NH}$$

with side chain $\text{CH}$ on middle repeat unit; $n = 5, m = 1, z = 10$ $$\text{CH}_3 \qquad\qquad\qquad\qquad \text{CH}_3$$
$$\text{CH}_2\text{CH}_2\overset{|}{\underset{|}{\text{C}}} - [-(\text{CH}_2\text{CH}=\text{CHCH}_2)_{\overline{x}}(\text{CH}_2\overset{|}{\text{CH}})_{\overline{y}} -]_z - \overset{|}{\underset{|}{\text{C}}}\text{CH}_2\text{CH}_2 - \text{R}$$
$$\text{CH}_3 \qquad\qquad\qquad \text{CN} \qquad\quad \text{CH}_3$$

R = —COOH (CTBN, CTB)

—COOCH$_2$CHCH$_2$OCOCH=CH$_2$ (VTBN)
$\phantom{XXXXX}|$
$\phantom{XXXXX}$OH

Incombustible agents and inorganic fillers may be suitably added. Inorganic fillers may be used which are water-insoluble and insulating. Examples of such inorganic fillers are metal oxides, such as silica, alumina, zirconia, titanium dioxide and zinc flower, metal hydroxides, such as magnesium hydroxide and aluminum hydroxide, natural minerals as talc, kaolin, mica, waltherite and clay minerals, and insoluble salts as calcium carbonate, magnesium carbonate, barium sulfate and calcium phosphate. Examples of the reinforcement material are woven fabric, non-woven fabric, mat, paper and combinations of these materials, and continuous fibers such as carbon fibers, glass fibers, aramide fibers, liquid crystal polyester fibers, poly(p-phenylenebenzobisthiazole) (PBT) and poly(p-phenylenebenzobisoxazole) (PBO) fibers, alumina fibers and so forth. These reinforcement materials may be treated with silane coupling agents to enhance adhesion to the blend.

The blend resin concentration when dissolved and diluted in the organic solvent, is 5 to 85% by weight, preferably 15 to 65% by weight, more preferably 35 to 65 % by weight. The residual solvent concentration in the prepreg, in the reinforcement material-to-resin ratio, is 1 to 20 % by weight, preferably 1 to 10% by weight, preferably 1 to 5% by weight.

If the weight ratio is insufficient, the mechanical characteristics of the laminate obtainable after the prepreg formation will be insufficient. If the weight ratio is excessive, damage may be inflicted on the reinforcing fiber.

The invention will be better understood by reference to the following examples which are included for purposes of illustration and not limitation. The following terms which are used throughout the examples and claims have the following definitions: g—gram(s), mol—mole(s), ml—milliliter, L—liter(s)

EXAMPLE 1

A method of synthesizing 1,3-bis(4-dinitrophenoxy)-2,2-dimethyl propane will be described.

To a dried 2,000 ml round bottom flask were attached a N$_2$ bubbler, a Dimroth reflux condenser and a mechanical stirrer, and the flask was flushed with N$_2$. 146.1 g (0.920 mole) of 1-nitro-4-chlorobenzene and 45.1 g (0.470 mole) of 2,2-dimethylpropane-1,3-diol were well mixed in a mortar and then added to the flask. The mixture was dissolved in 200 ml of N-N'-dimethylacetamide, and then 400 g (2.820 mole) of anhydrous K$_2$CO$_3$ was added to the solution. The system was stirred under reflux in a N$_2$, stream for 26 hours. The reaction liquid was added to 2,000 ml of ice water and carefully neutralized with concentrated HCl. The precipitate that formed was then filtered, and recrystallized twice using toluene.

The product was then dried under reduced pressure (@ 65° C.) to obtain 133.3 g (yield: 82.0%) of the dinitro compound (hereinafter referred to as BNPDMP), the melting point of which was 165°-6° C. (reported value: 164° C.).

Spectral data of the obtained BNPDMP were as follows.

IR (KBr, cm$^{-1}$): $\nu$=3100, 2950, 1680, 1600, 1500, 1340, 1290, 1170, 1120, 1040, 1000, 860, 770, 680

$^1$H-NMR (acetone-d$_6$): $\delta$=1.20 (s,6H, —CH$_3$), 4.08 (s, 4H, —CH$_2$—O—), 7.19 (m, 4H, aromatic H), $2^{nd}$ 8.15 ppm (m 4H, aromatic H) Elemental analysis for C$_{17}$H$_{18}$N$_2$: Calculated value (%): C: 58.74H: 23.83 Measured value (%): C: 58.56, H: 23.92

EXAMPLE 2

Now, a method of synthesizing 1,3-bis(4-diaminophenoxy)-2,2-dimethyl propane will be described.

To a dried 2,000 ml round bottom flask were attached a bubbler, a N$_2$ bubbler, Dimroth reflux condenser, a mechanical stirrer, and a 1,000 ml addition funnel containing 600.0 g (12.080 mol) of hydrazine hydrate. To the flask was added 286.44 g (0.841 mol) of BNPDMP, 13.71 g of 5 wt. % Pd—C and 1,000 ml of dry ethanol. The mixture was heated to reflux and hydrazine was added dropwise over a 90 minute period. After the mixture was stirrer and heated at reflux for an additional 4 hours, it was filtered through celite under reduced pressure. The filtrate was reduced to dryness under reduced pressure. The residue was recrystallized using ethanol to obtain 196.8 g (yield: 95.5%) of diamine (hereinafter referred to as BAPDMP), having a melting point of 114°-5° C. (reported value: 113° C.). Spectral data of the obtained BAPDMP are as follows.

IR (KBr, cm$^{-1}$): $\xi$=3420, 3350, 3200, 2950, 2900, 2850, 1725, 1610, 1510, 1460, 1410, 1250, 1130, 1040, 820 $^1$H-NMR (acetone-d$_6$): $\delta$=1.10 (s, 6H,—CH$_3$), 3.40 (bs, 4H, —NH$_2$), 3.80 (s, 4H, —CH$_2$—O—), 2$^{nd}$6.15 ppm (m, 8H, aromatic H) Elemental analysis for C$_{17}$H$_{22}$N$_2$: Calculated value (%): C: 73.30, H: 7.91 Measured value (%): C: 73.56, H: 7.78

$\delta$. Further, to examine the moisture resistance of the heat-resistant laminate material thus produced, a solder heat resistance test accompanying a pressure cooker test was conducted, and swelling was checked for by appearance observation.

Table 1 shows the results of the observations.

TABLE 1

| Ratio of Components | | | | Flexural strength (MPa) | Flexural modulus (GPa) | Tensile strength (MPa) | Fracture E G$_{1c}$(KJ/m$^2$) | Tg (°C.) | Solder Resistance Test | |
|---|---|---|---|---|---|---|---|---|---|---|
| PMDA | BTDA | ODPA | Thermid IP-600 | | | | | | 260° C. (30 s) | PCT |
| 1 | 0 | 0 | 70 | 30 | 1022.5 | 38.1 | 1015 | 1.65 | 230 | s | s |
| 2 | 0 | 70 | 0 | 30 | 1222.7 | 71.5 | 1129 | 1.52 | 254 | s | s |
| 3 | 14 | 56 | 0 | 30 | 1047.4 | 58.6 | 1254 | 1.87 | 250 | s | s |
| 4 | 28 | 0 | 42 | 30 | 1243.6 | 47.9 | 1185 | 1.60 | 244 | s | s |
| 5 | | | | | 480.0 | 20.3 | 250 | | 276 | s | x |
| 6 | | | | | 850.0 | 21.5 | 170 | | 256 | s | s |

Swelling observed after solder bath:
s (satisfactory) - no swelling observed
x (unsatisfactory) - swelling observed
PCT (pressure cooker test): swelling observed after 30 second solder bath at 260° C. subsequent to treatment at 121° C. and under 2 atm. for 5 hours
s (satisfactory) - no swelling observed
x (unsatisfactory) - swelling observed

EXAMPLE 3

(Sample #1)

To a 1,000 ml 4-necked reaction vessel were attached a N$_2$ inlet and an outlet, and a mechanical stirrer. After the vessel was flushed with N$_2$, 38.8631 g (0.125284 mol) of oxydiphthalic acid dianhydride (hereinafter referred to as ODPA) and 15 ml of NMP were added while controlling the temperature of the reaction system to 76°±2° C. After confirming that the solution was homogeneous, 50.0 ml (1.26 mol) of dry methanol was added. Oxydiphthalic acid dimethylester was formed by stirring the system at the same temperature for 60 minutes. A solution obtained by dissolving 34.861 g (0.12526 mol) of BAPDMP in 100 ml of dry THF at 76°±2° C. was added. The mixture was then stirred for 2 hours while maintaining the temperature at 76°±2° C. To the reaction mixture was then added a solution prepared by dissolving 25.0 g of "Thermid IP-600" in a mixture of 60 ml of THF and 15 ml of NMP. The resultant system was blended uniformly by stirring it for 2 hours. The viscosity of the mixture after the reaction and blending was measured using a Brookfield Viscometer and found to be 19 poise.

Figure 2:
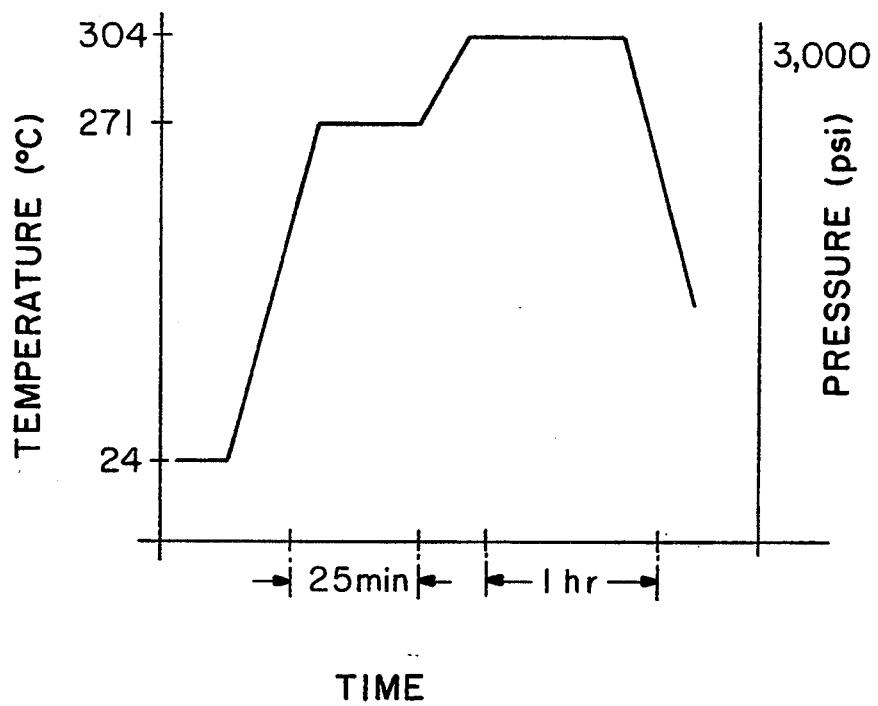
FIG. 2 illustrates a compression molding cycle showing a heating ramp at 2°/min. to 300° C., a 25 minute hold under pressure, a second heating ramp at 1°/min., an hour hold still under pressure, followed by a 2°/min. cooling ramp under pressure to a temperature below 65° C.

Then, the blend mixture was coated on glass cloth (available with a product number "RST57PA-535CS" from Nittobo Co., Ltd.) to impregnate the same by using a prepregger, i.e., a "Model 130 Prepregger" manufactured by Research Tool Co., Ltd. Using the resultant system, a unidirectional reinforced prepreg was produced with two rollers. This reinforced prepreg was cut to a predetermined standard size and then dried under the drying condition shown in FIG. 1. 22 prepregs thus obtained, each 102 mm in length and 76 mm in width, were pressed in a stack in precision dies using a press with heater under the condition shown in FIG. 2, thus obtaining a heat-resistant laminate material with a thickness of 3.25 mm.

Of the heat-resistant laminate material thus obtained, the flexual strength, flexual modulus, G$_{1c}$ (fracture energy) and glass transition temperature (T$_g$) were measured. The flexural strength and flexural modulus were measured in conformity to ASTM D790M-86. The glass transition point (T$_g$) was measured using "DMS 200" by Seiko Co., Ltd. and evaluated with the peak value of tan $\delta$.

EXAMPLE 4

(Sample #2)

A blend solution was obtained in the same manner as shown in Example 3 except for using 40.0686 g (0.1248 mol) of benzophenone tetracarboxylic acid dianhydride (hereinafter referred to as BTDA), 34.7545 g (0.1249 mol) of BAPDMP and 19 g of "Thermid IP-600". The resin viscosity of the obtained resin solution was obtained and found to be 21 poise.

Using the obtained blend solution, a heat-resistant laminate material with a thickness of 3.42 mm was produced in the manner as shown in Example 3.

Of the heat-resistant laminate material thus produced, the various physical property values were measured in the manner as shown in Example 3, and also the moisture resistance was examined. The results of evaluation are shown in Table 1.

EXAMPLE 5

(Sample #3)

A blend solution was obtained in the manner as shown in Example 3 except for using 9.2031 g (0.0422 mol) of pyromellitic acid dianhydride (hereinafter referred to as PMDA), 20.3560 g (0.06 mol) of BTDA, 29.3297 g (0.10539 mol) of BAPDMP and 20 g of "Thermid IP-600". The resin viscosity of the resin solution thus obtained was measured and found to be 16 poise.

Using the blend solution thus obtained, a heat-resistant laminate material with a thickness of 3.42 mm was obtained in the manner as shown in Example 3.

Of the heat-resistant laminate material thus produced, the various physical property values were measured in the manner as shown in Example 3, and also the moisture resistance was examined. The results of the evaluation are shown in Table 1.

EXAMPLE 6

(Sample #4)

A blend solution was obtained in the manner as shown in Example 3 except for using 20.8816 g (0.09574 mol) of PMDA, 44.5310 g (0.14356 mol) of ODPA, 66.4659 g (0.23883 mol) of BAPDMP and 57 g of "Thermid IP-600". The resin viscosity of the obtained resin solution was measured and found to be 28 poise.

Using the blend solution thus obtained, a heat-resistant laminate material with a thickness of 3.64 mm was produced in the manner as shown in Example 3.

Of the heat-resistant laminate material thus produced, the various physical property values were measured, and the moisture resistance was examined. The results of the evaluation are shown in Table 1.

COMPARATIVE EXAMPLE 7

(Sample #5)

95 g of "Kerimid 601" (purchased from Nippon Polyimide Co., Ltd.) was dissolved in 120 g of DMF (resin concentration: 45 wt. % DMF). The resin solution thus obtained was coated on glass fibers to impregnate the cloth in the same manner as shown in Example 1, followed by drying in a hot air circulation furnace at 120° C., or 85 minutes to produce a prepreg with a resin concentration of 40.2% by weight and a residual solvent concentration of 6.4%.

Eight prepregs thus formed were laminated at 220° C. for 2 hours at 25 kg/cm² using a press with heater to obtain a laminate with a thickness of 3.7 mm.

Of the heat-resistant laminate material thus produced, the various physical property values were measured in the same manner as in Example 4, and the moisture resistance was examined. The results of this evaluation are shown in Table 1.

COMPARATIVE EXAMPLE 8

(Sample #6)

165 g of imide oligomer, i.e., "Thermid MC-600" (purchased from Kanebo NSC Co., Ltd.), was dissolved in 2,000 g of DMF (resin concentration: 45 wt.%). The obtained resin solution was coated on glass fibers to impregnate the same as shown in Example 4, followed by drying in a hot air re-circulation furnace at 120° C. for 35 minutes to obtain a prepreg with a resin concentration of 31.2% by weight and a residual solvent concentration of 9.4%.

Eight prepregs thus obtained were laminated at 220° C. for 2 hours at 25 kg/cm² to obtain a laminate with a thickness of 6.2 mm.

Of the heat-resistant laminate material thus obtained, the various physical property values were measured in the same manner as in Example 4, and the moisture resistance was examined. The results of this evaluation are shown in Table 1.

While in accordance with the patent statutes the best mode and preferred embodiment of the invention have been described, it is to be understood that the invention is not limited thereto, but rather is to be measured by the scope and spirit of the appended claims.

What is claimed is:

1. A heat-resistant polyimide blend comprising:
(a) a thermoplastic polyimide represented by formula (VI),

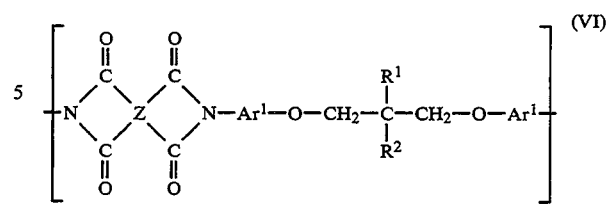

where Z is a tetravalent organic radical selected from the group consisting of a carbocyclic aromatic containing radical and a heterocyclic aromatic containing radical where each anhydride group is located on an aromatic ring with the carbonyl units in an ortho orientation relative to one another, and where $R^1$ and $R^2$ each represent a substituent group selected from the group consisting of hydrogen, aliphatic and aromatic groups from about 1 to 18 carbons, and halogenated aliphatics and aromatics from 1 to 18 carbons, the groups $R^1$ and $R^2$ being the same or different, and $Ar^1$ a divalent organic aromatic group where the ether linkage and amine linkage are in a para arrangement; and (b) a thermosetting imide oligomer represented by formula (II), $$HC{\equiv}C-\bigcirc-[X{=}Z{=}X-Q]_n-X{=}Z{=}X-\bigcirc-C{\equiv}CH \quad (II)$$

wherein Z is as previously defined, the groups Z being either the same or different, and where Q is divalent organic radical selected independently from the group consisting of a carbocyclic aliphatic radical, a carbocyclic aromatic containing radical, and a heterocyclic containing radical, wherein the term carbocyclic aromatic containing radical and heterocyclic aromatic containing radical used to define Z, is meant to include any radical which has the anhydride groups attached to one or more aromatic ring(s) and when describing Q has the amine groups attached to one or more aromatic ring(s), n being a positive integer of from 1 to 30, and X is a form of trivalent bond shown attached to group Z, which occupies two of the bonds, thereby leaving one additional bond for subsequent bonding to other components of the oligomer, and selected from the chemical formula group consisting of (IIIa)  (IIIb)  (IIIc)

2. A method of manufacturing a heat-resistant polyimide blend solution comprising the steps of:
(a) preparing a precursor of a thermoplastic polyimide represented by formula (VI),

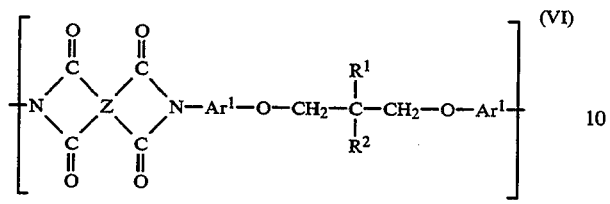

where Z is a tetravalent organic radical selected from the group consisting of a carbocyclic aromatic containing radical and a heterocyclic aromatic containing radical where each anhydride group is located on an aromatic ring with the carbonyl units in an ortho orientation relative to one another, and where $R^1$ and $R^2$ each represent a substituent group selected from the group consisting of hydrogen, aliphatic and aromatic groups from about 1 to 18 carbons, and halogenated aliphatics and aromatics from 1 to 18 carbons, the groups $R^1$ and $R^2$ being the same or different, and $Ar^1$ a divalent organic aromatic group where the ether linkage and amine linkage are in a para arrangement, the precursor having been prepared by the steps of dissolving a tetracarboxylic acid dianhydride ester and a diamine of represented by formula (VIII)

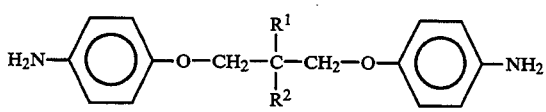

in an aprotic polar solvent at a temperature from 50° C. to 150° C. for 1 to 10 hours; and
(b) dissolving a thermosetting imide oligomer represented by formula (II),

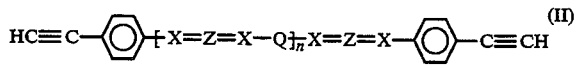

in the aprotic polar solvent with stirring to form the blend solution, wherein Z is as previously defined, the groups Z being either the same or different, and where Q is divalent organic radical selected independently from the group consisting of a carbocyclic aliphatic radical, a carbocyclic aromatic containing radical, and a heterocyclic containing radical, wherein the term carbocyclic aromatic containing radical and heterocyclic aromatic containing radical used to define Z, is meant to include any radical which has the anhydride groups attached to one or more aromatic ring(s) and when describing Q has the amine groups attached to one or more aromatic ring(s), n being a positive integer of from 1 to 30, and X is a form of trivalent bond shown attached to group Z, which occupies two of the bonds, thereby leaving one additional bond for subsequent bonding to other components of the oligomer, and selected from the chemical formula group consisting of

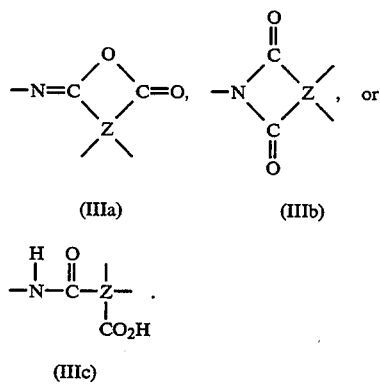

3. The polyimide blend of claim 1, wherein a weight ratio of the thermoplastic polyimide represented by formula (VI) to the thermosetting imide oligomer represented by formula (II) is selected in a range of 99/1 to 5/95.

4. The polyimide blend of claim 1, wherein the thermoplastic polyimide represented by formula (VI) has a number-average molecular weight of 10,000 or above.

5. The method of claim 2 wherein the aprotic polar solvent is selected from the group consisting of ether solvents, sulfoxide solvents, formamide solvents, acetamide solvents, N-methylpyrrolidinone and mixtures thereof.

6. The method of claim 5 wherein the ether solvent is selected from the group consisting of tetrahydrofuran and dioxane, and wherein the sulfoxide solvent is selected from the group consisting of dimethyl sulfoxide and diethyl sulfoxide, and wherein the formamide solvent is selected from the group consisting of N,N'-dimethylformamide and N,N'-diethylformamide, and wherein the acetamide solvent is selected from the group consisting of N,N'-dimethylacetamide and N,N'-diethylacetamide.

7. The method of claim 5 wherein the aprotic solvent is combined with a non-solvent of a polyamic acid.

8. The method of claim 7 wherein the non-solvent is selected from the group consisting of an alcohol, aralkyl cellosolve and mixtures thereof.

* * * * *